(12) United States Patent
Teo et al.

(10) Patent No.: US 8,772,147 B2
(45) Date of Patent: Jul. 8, 2014

(54) SPACER STRUCTURES OF A SEMICONDUCTOR DEVICE

(71) Applicant: Taiwan Semiconductor Manufacturing Company, Ltd., Hsinchu (TW)

(72) Inventors: Lee-Wee Teo, Singapore (SG); Ming Zhu, Singapore (SE); Hui-Wen Lin, Taiping (TW); Bao-Ru Young, Zhubei (TW); Harry-Hak-Lay Chuang, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 14/032,811

(22) Filed: Sep. 20, 2013

(65) Prior Publication Data

US 2014/0017886 A1 Jan. 16, 2014

Related U.S. Application Data

(60) Division of application No. 13/646,476, filed on Oct. 5, 2012, now Pat. No. 8,557,659, which is a continuation of application No. 12/846,261, filed on Jul. 29, 2010, now Pat. No. 8,304,840.

(51) Int. Cl.
*H01L 29/40* (2006.01)
*H01L 21/8234* (2006.01)
*H01L 21/8238* (2006.01)

(52) U.S. Cl.
CPC *H01L 21/823425* (2013.01); *H01L 21/823468* (2013.01); *H01L 21/823864* (2013.01)
USPC .......................................... 438/587; 438/257

(58) Field of Classification Search
CPC ................... H01L 21/823437; H01L 21/8235; H01L 21/82348; H01L 21/82328; H01L 21/82342; H01L 21/82385
USPC ........................... 438/587, 279; 257/202, 206
See application file for complete search history.

(56) References Cited

U.S. PATENT DOCUMENTS

| 8,110,901 B2 | 2/2012 | Breitwisch et al. |
| 2002/0137296 A1 | 9/2002 | Satoh et al. |
| 2003/0015752 A1 | 1/2003 | Palm et al. |
| 2008/0017904 A1 | 1/2008 | Akiyama et al. |
| 2008/0280431 A1 | 11/2008 | Jung et al. |
| 2008/0296637 A1* | 12/2008 | Shin et al. ..................... 257/288 |

(Continued)

*Primary Examiner* — Tom Thomas
*Assistant Examiner* — John Bodnar
(74) *Attorney, Agent, or Firm* — Lowe Hauptman & Ham, LLP

(57) ABSTRACT

A method of fabricating a semiconductor device includes forming a first set of gate electrodes over a substrate, adjacent gate electrodes of the first set of gate electrodes being separated by a first gap width, and having a first gate width. The method includes forming a second set of gate electrodes over the substrate, adjacent gate electrodes of the second set of gate electrodes being separated by a second gap width less than the first gap width, and having a second gate width greater than the first gate width. The method further includes forming a first set of spacer structures on sidewalls of the first and second sets of gate electrodes. The method further includes forming a second set of spacer structures abutting the first set of spacer structures and removing a subset of the second set of spacer structures over the sidewalls of the second set of gate electrodes.

20 Claims, 13 Drawing Sheets

(56) References Cited

U.S. PATENT DOCUMENTS

| | | | |
|---|---|---|---|
| 2010/0072560 A1* | 3/2010 | Lee et al. ............... 257/393 |
| 2010/0295134 A1 | 11/2010 | Nagashima et al. |
| 2010/0301409 A1 | 12/2010 | Breitwisch et al. |
| 2011/0026327 A1 | 2/2011 | Huang et al. |
| 2011/0275207 A1 | 11/2011 | Moniwa et al. |

* cited by examiner

SPACER STRUCTURES OF A SEMICONDUCTOR DEVICE

PRIORITY CLAIM

The present application is a divisional of U.S. application Ser. No. 13/646,476, filed Oct. 5, 2012, which is a divisional of U.S. Pat. No. 8,304,840, issued Nov. 6, 2012, the disclosures of which are incorporated here by reference in their entireties.

TECHNICAL FIELD

The disclosure relates to integrated circuit fabrication, and more particularly to a semiconductor device with spacer structures.

BACKGROUND

As the technology nodes shrink, in some integrated circuit (IC) designs, there has been a desire to replace the typically polysilicon gate electrode with a metal gate electrode to improve device performance with the decreased feature sizes. One process of forming a metal gate structure is termed a "gate last" process in which the final gate structure is fabricated "last" which allows for a reduced number of subsequent processes, including high temperature processing, that must be performed after formation of the gate. Additionally, as the dimensions of transistors decrease, the thickness of the gate oxide must be reduced to maintain performance with the decreased gate length. In order to reduce gate leakage, high-dielectric-constant (high-k) gate dielectric layers are also used which allow greater physical thicknesses while maintaining the same effective thickness as would be provided by a thinner layer of the gate oxide used in larger technology nodes.

However, there are challenges to implementing such features and processes in complementary metal-oxide-semiconductor (CMOS) fabrication. As the gate length and spacing between devices decrease, these problems are exacerbated. For example, in a "gate last" fabrication process, voids may be generated during deposition of an inter-layer dielectric (ILD) layer for gap filling due to a high aspect ratio opening between gate spacers.

Accordingly, what is needed is an improved device and method of spacer formation.

SUMMARY

In one embodiment, a semiconductor device comprises a substrate having a first active region and a second active region; a plurality of first gate electrodes having a gate pitch over the first active region, wherein each first gate electrode has a first width; a plurality of first spacers adjoining the plurality of first gate electrodes, wherein each first spacer has a third width; a plurality of second gate electrodes having the same gate pitch as the plurality of first gate electrodes over the second active region, wherein each second gate electrode has a second width greater than the first width; and a plurality of second spacers adjoining the plurality of second gate electrodes, wherein each second spacer has a fourth width less than the third width.

In another embodiment, a semiconductor device comprises a substrate having a first active region and a second active region; a plurality of first gate electrodes having a gate pitch over the first active region, wherein each first gate electrode has a first width; a plurality of first spacers adjoining the plurality of first gate electrodes, wherein each first spacer has a third width; a plurality of second gate electrodes having the same gate pitch as the plurality of first gate electrodes over the second active region, wherein each second gate electrode has a second width greater than the first width; a plurality of second spacers adjoining the plurality of second gate electrodes, wherein each second spacer has a fourth width less than the third width; a plurality of first silicide regions in the first active region on opposite sides of the plurality of first gate electrodes, wherein an inner edge of each first silicide region is offset from an outer edge of the each first spacer; and a plurality of second silicide regions in the second active region on opposite sides of the plurality of the second gate electrodes, wherein an inner edge of each second silicide region is substantially aligned with an outer edge of the each second spacer.

In still another embodiment, a method of fabricating a semiconductor device comprises providing a substrate having a first active region and a second active region; forming a plurality of first gate electrodes having a gate pitch over the first active region, wherein each first gate electrode has a first width, and a plurality of second gate electrodes having the same gate pitch as the plurality of first gate electrodes over the second active region, wherein each second gate electrode has a second width greater than the first width; depositing a first oxygen-sealing layer on the plurality of the first gate electrodes and the plurality of second gate electrodes; depositing an oxygen-containing layer on the first oxygen-sealing layer; depositing a second oxygen-sealing layer on the oxygen-containing layer; removing a portion of the second oxygen-sealing layer over top surfaces of the plurality of the first gate electrodes and the plurality of the second gate electrodes; and removing the second oxygen-sealing layer over the second active region.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features in the drawings may be arbitrarily increased or reduced for clarity of discussion.

DESCRIPTION

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity. In addition, the present disclosure provides examples based on a "gate last" metal gate structure, however, one skilled in the art may recognize applicability to other structures and/or use of other materials.

Figure 1:
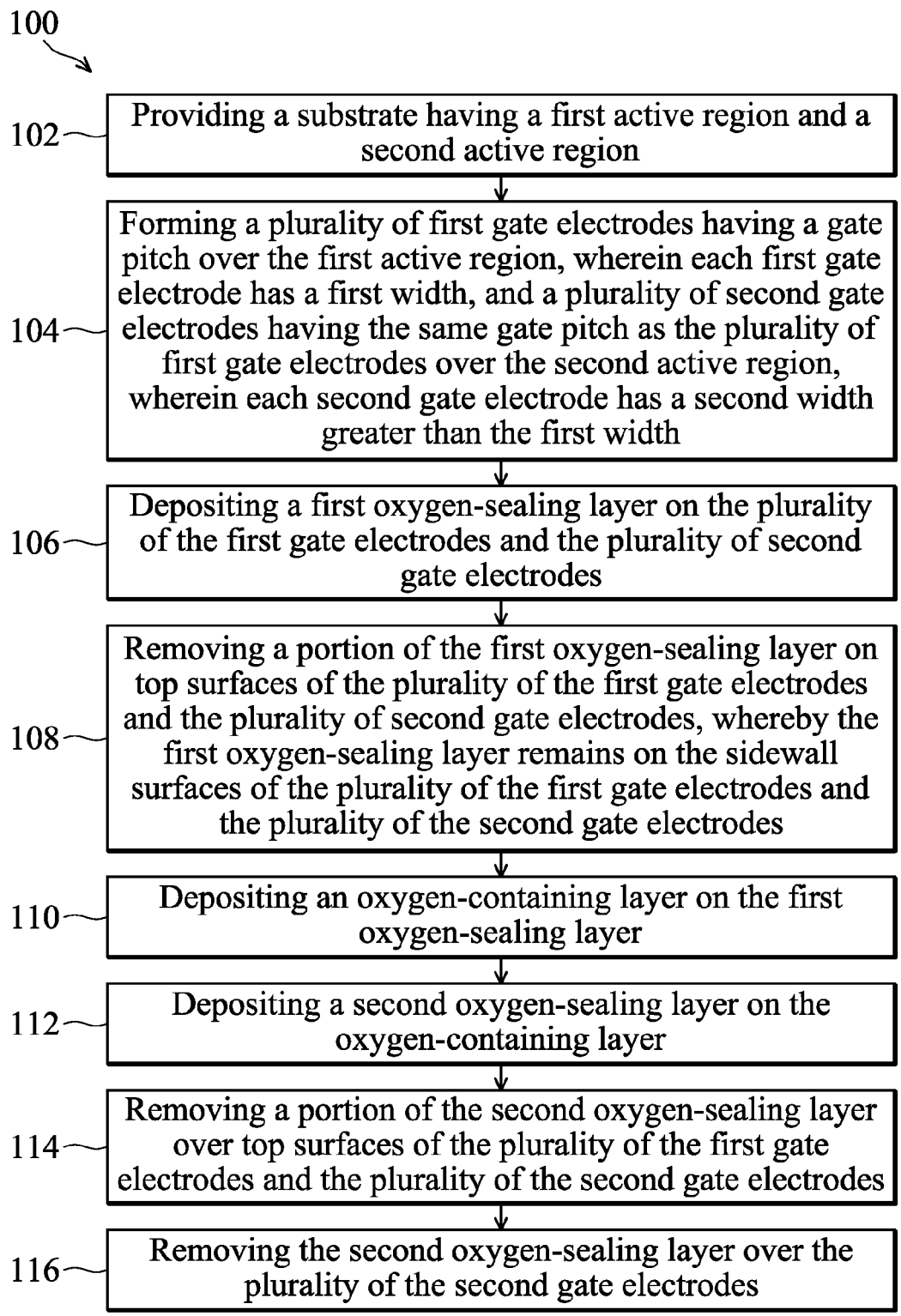
FIG. 1 is a flowchart illustrating a method for fabricating spacer structures of a semiconductor device according to various aspects of the present disclosure.
Figure 2A:
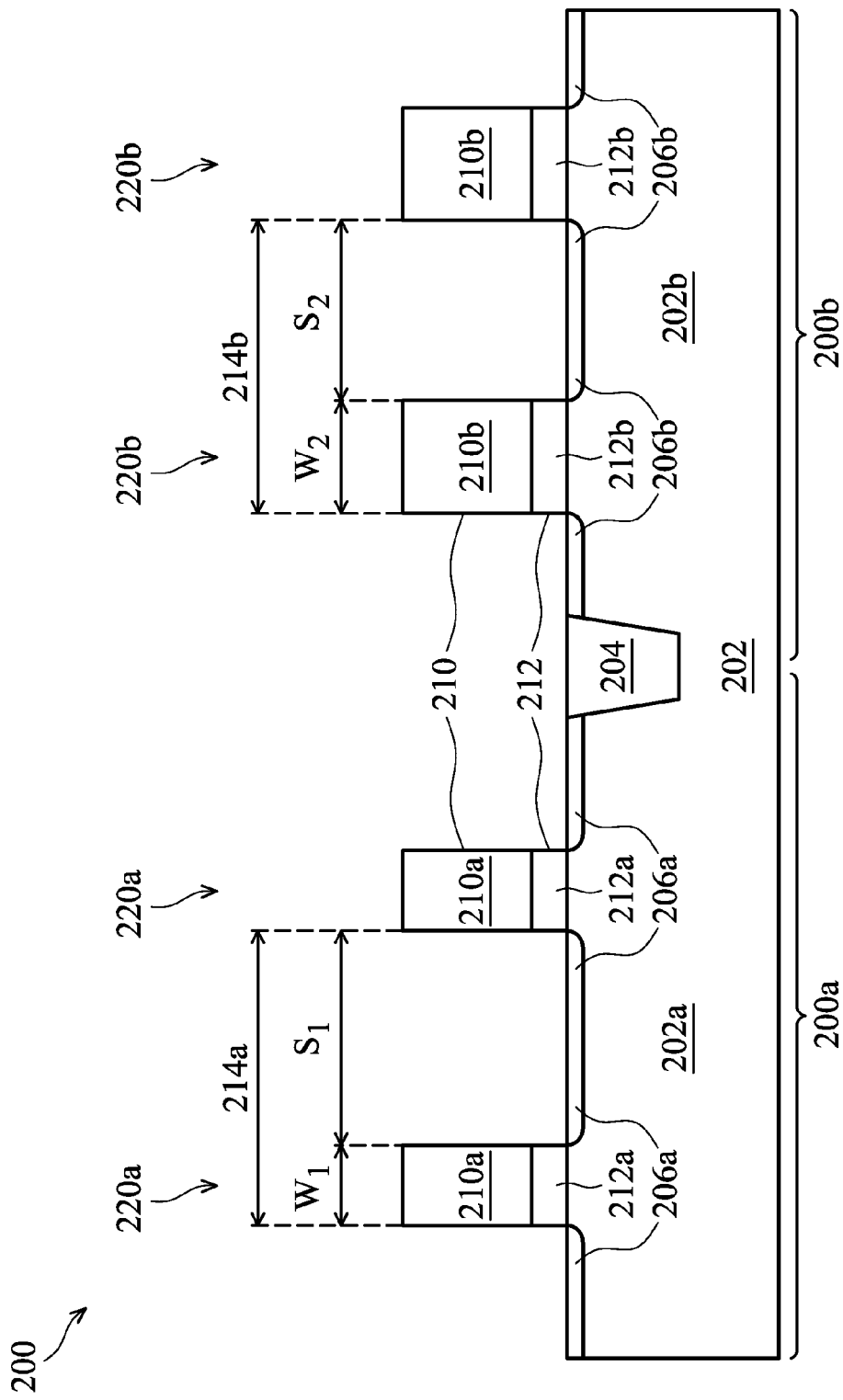
FIGS. 2A-K show schematic cross-sectional views of spacer structures of a semiconductor device at various stages of fabrication according to various aspects of the present disclosure.

FIG. 1 is a flowchart illustrating a method 100 for fabricating spacer structures 230a, 230b (shown in FIGS. 2J and 2K) of a semiconductor device 200 according to various aspects of the present disclosure. FIGS. 2A-K show schematic cross-sectional views of spacer structures 230a, 230b of a semiconductor device 200 at various stages of fabrication according to various aspects of the present disclosure. In some embodiments, the semiconductor device of FIG. 1 may be further processed using CMOS technology processing. Accordingly, it is understood that additional processes may be provided before, during, and after the method 100 of FIG. 1, and that some other processes may only be briefly described herein. Also, FIGS. 1 through 2K are simplified for a better understanding of the inventive concepts of the present disclosure. For example, although the figures illustrate the spacer structures 230a, 230b for a semiconductor device 200, it is understood the semiconductor device may be part of an IC that further comprises a number of other devices such as resistors, capacitors, inductors, fuses, etc.

Referring to FIG. 1, the method 100 begins at step 102 wherein a substrate 202 having a first active region 202a and a second active region 202b is provided. The substrate 202 may comprise a silicon substrate. The substrate 202 may alternatively comprise silicon germanium, gallium arsenic, or other suitable semiconductor materials. The substrate 202 may further comprise other features such as various doped regions, a buried layer, and/or an epitaxy layer. Furthermore, the substrate 202 may be a semiconductor on insulator such as silicon on insulator (SOI) or silicon on sapphire. In other embodiments, the substrate 202 may comprise a doped epi layer, a gradient semiconductor layer, and/or may further include a semiconductor layer overlying another semiconductor layer of a different type such as a silicon layer on a silicon germanium layer. In other examples, a compound semiconductor substrate 202 may comprise a multilayer silicon structure or a silicon substrate may include a multilayer compound semiconductor structure.

The first and second active regions 202a, 202b may include various doping configurations depending on design requirements. In some embodiments, the first and second active regions 202a, 202b may be doped with p-type or n-type dopants. For example, the first and second active regions 202a, 202b may be doped with p-type dopants, such as boron or $BF_2$; n-type dopants, such as phosphorus or arsenic; and/or combinations thereof. The two active regions 202a, 202b may be the same doping type, or different doping types. The first and second active regions 202a, 202b may be configured for an N-type metal-oxide-semiconductor transistor (referred to as an NMOS) or for a P-type metal-oxide-semiconductor transistor (referred to as a PMOS). In the present embodiment, the first active region 202a may be configured for a logic device to form a logic region 200a and the second active region 202b may be configured for a memory device to form a static random access memory (SRAM) region 200b.

In some embodiments, isolation structure 204 may be formed on the substrate 202 to isolate the first active region 202a and second active region 202b. The isolation structure 204 may utilize isolation technology, such as local oxidation of silicon (LOCOS) or shallow trench isolation (STI), to define and electrically isolate the first active region 202a and second active region 202b. In the present embodiment, the isolation structure 204 comprises a STI. The isolation structure 204 may comprise silicon oxide, silicon nitride, silicon oxynitride, fluoride-doped silicate glass (FSG), a low-k dielectric material, other suitable materials, and/or combinations thereof. The isolation structure 204, and in the present embodiment, the STI, may be formed by any suitable process. In at least one embodiment, the formation of the STI may include patterning the semiconductor substrate 202 by a photolithography process, etching a trench in the substrate 202 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Next step 104 is performed to fabricate a plurality of first and second electrodes. An example of a structure resulting from the step 104 is shown in FIG. 2A. As depicted in FIG. 2A, a gate dielectric layer 212 is formed over the substrate 202. In some embodiments, the gate dielectric layer 212 may comprise silicon oxide, high-k dielectric material or combination thereof. A high-k dielectric material is defined as a dielectric material with a dielectric constant greater than that of $SiO_2$. The high-k dielectric layer comprises metal oxide. The metal oxide is selected from the group consisting of oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or mixtures thereof. The gate dielectric layer 212 may be grown by a thermal oxidation process, a chemical vapor deposition (CVD) process, an atomic layer deposition (ALD) process, and may have a thickness less than 2 nm.

In some embodiments, the gate dielectric layer 212 may further comprise an interfacial layer (not shown) to minimize stress between the gate dielectric layer 212 and the substrate 202. The interfacial layer may be formed of silicon oxide or silicon oxynitride grown by a thermal oxidation process. In at least one embodiment, the interfacial layer is grown by a rapid thermal oxidation (RTO) process or in a conventional annealing process comprising oxygen.

And then, a dummy gate electrode layer 210 may be formed over the gate dielectric layer 212. In some embodiments, the dummy gate electrode layer 210 may comprise a single layer or multilayer structure. In the present embodiment, the dummy gate electrode layer 210 may comprise poly-silicon. Further, the dummy gate electrode layer 210 may be doped poly-silicon with the uniform or gradient doping. The dummy gate electrode layer 210 may have any suitable thickness. In the present embodiment, the dummy gate electrode layer 210 has a thickness in the range of about 30 nm to about 60 nm. The dummy gate electrode layer 210 may be formed using a low-pressure chemical vapor deposition (LPCVD) process. In at least one embodiment, the LPCVD process can be carried out in a standard LPCVD furnace at a temperature of about 580° C. to 650° C. and at a pressure of about 200 mTorr to 1 Torr, using silane ($SiH_4$), disilane ($Si_2H_6$), trisilane ($Si_3H_8$) or dichlorosilane ($SiH_2Cl_2$) as the silicon source gas.

In the present embodiment, a plurality of first gate stacks 220a and a plurality of second gate stacks 220b are thus formed by patterning the blanket films of the gate dielectric layer 212 and dummy gate electrode layer 210. After a hard mask layer (not shown) is deposited, the hard mask layer is patterned using a photo-sensitive layer (not shown). Then a plurality of the first and second gate stacks 220a, 220b are patterned through the hard mask layer using a reactive ion etching (RIE) or a high density plasma (HDP) process, exposing a portion of the substrate 202. In the present embodiment, a plurality of the first gate stacks 220a comprises a plurality of the first gate electrodes 210a and the gate dielectric layer 212a. A plurality of the second gate stacks 220b comprises a plurality of the second gate electrodes 210b and the gate dielectric layer 212b.

In some embodiments, the hard mask layer (not shown) may be formed over the dummy gate electrode layer 210 to protect the dummy gate electrode layer 210. The hard mask layer may include silicon nitride. The hard mask layer can be deposited by, for example, a CVD process, or a LPCVD process. The hard mask layer may have a thickness of about 100 to 400 Å.

Still referring to FIGS. 1 and 2A, the method 100 continues with step 104 in which a plurality of first gate electrodes 210a having a first gate pitch 214a is formed over the first active region 202a, wherein each first gate electrode 210a has a first width $W_1$, and a plurality of second gate electrodes 210b having a gate pitch 214b which is the same as that 214a of the plurality of the first gate electrodes 210a is formed over the second active region 202b, wherein each second gate electrode 210b has a second width $W_2$ greater than the first width $W_1$.

A gate pitch is defined as a summation of a gate width and a gate space. In the present embodiment, the first gate pitch 214a is a summation of the first gate width $W_1$ and a first gate space $S_1$ in the logic region 200a, and the second gate pitch 214b is a summation of the second gate width $W_2$ and a second gate space $S_2$ in the SRAM region 200b. In at least one embodiment, the first gate width $W_1$ may be in the range of about 10 to 30 nm. The first gate space $S_1$ may be in the range of about 30 to 100 nm. The first gate pitch 214a may be in the range of about 40 to 130 angstroms. The ratio of the first gate width $W_1$ to the first gate pitch 214a is from 0.20 to 0.25. In another embodiment, the second gate width $W_2$ may be in the range of about 12 to 40 nm. The second gate space $S_2$ may be in the range of about 28 to 90 nm. The second gate pitch 214b may be in the range of about 40 to 130 angstroms, which is the same as the first gate pitch 214a of the plurality of the first gate electrodes 210a. The ratio of the second gate width $W_2$ to the second gate pitch 214b is from 0.27 to 0.32.

In some embodiments, the first gate pitch 214a is same as the second gate pitch 214b for chip area saving. Further, in order to lower SRAM Vccmin ( ), the second width $W_2$ of each second gate electrode 210b is greater than the first width $W_1$ of each first gate electrode 210a, thereby the second space $S_2$ of each second gate electrode 210b is less than the first space $S_1$ of each first gate electrode 210a.

Also shown in FIG. 2A, after formation of a plurality of the first and second gate stacks 220a, 220b, lightly doped source and drain (LDD) regions 206a, 206b may be created in the first and second active regions 202a, 202b. This is accomplished via ion implantation of boron or phosphorous, at an energy between about 5 to 100 KeV, at a dose between about 1E11 to 1E 14 atoms/cm$^2$.

Figure 2B:
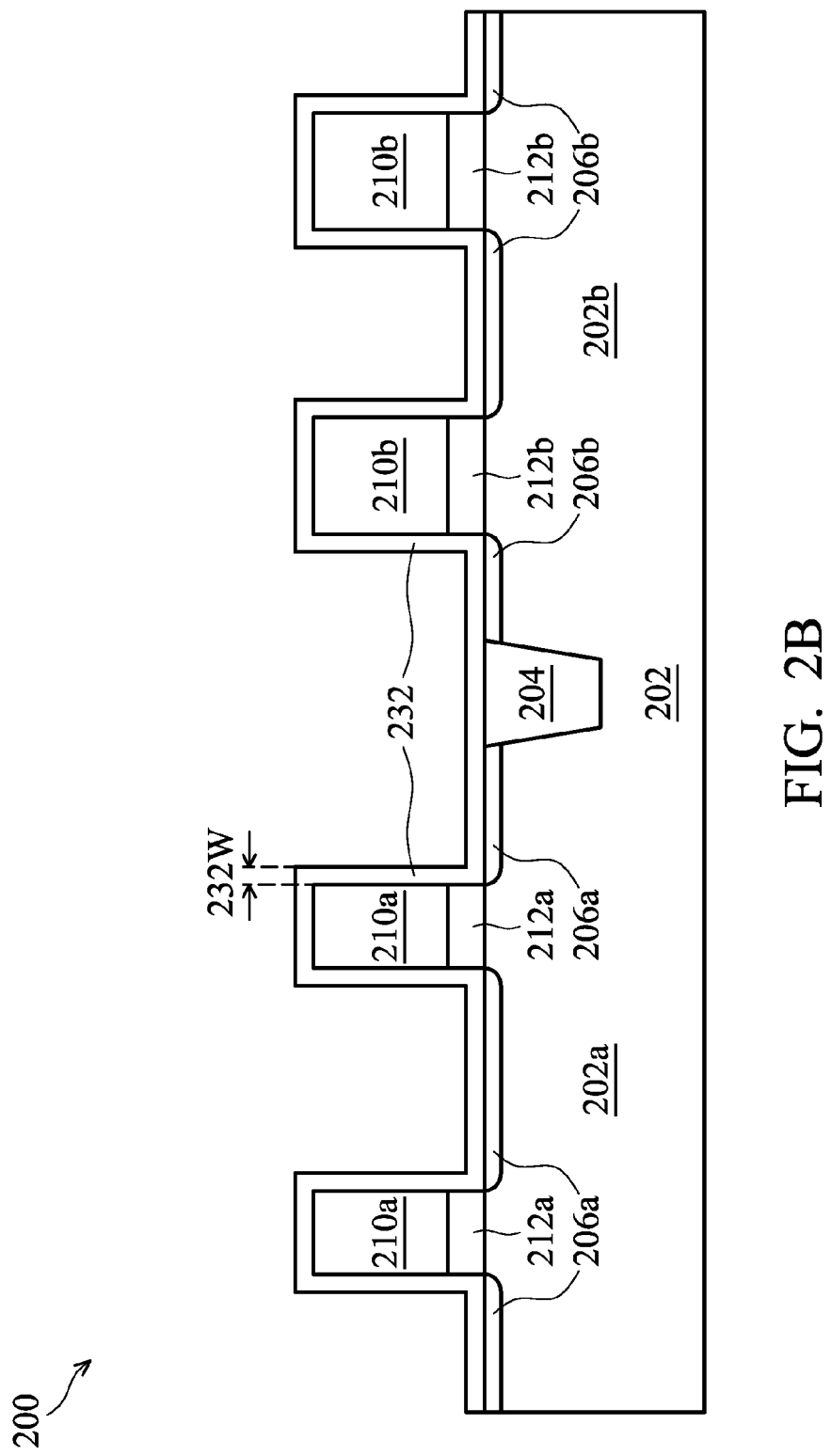

The method 100 in FIG. 1 continues with step 106 in which the structure in FIG. 2B is produced by depositing a first oxygen-sealing layer 232 on the plurality of first gate electrodes 210a and the plurality of second gate electrodes 210b. In the present embodiment, the first oxygen-sealing layer 232 comprises silicon nitride or carbon-doped silicon nitride. The first oxygen-sealing layer 232 has a width 232w in the range of about 3 to 10 nm. In some embodiments, the first oxygen-sealing layer 232 may be deposited using a molecular layer deposition (MLD) process. The MLD process of the present invention is generally carried out under a pressure less than 10 mTorr and in the temperature range from about 350° C. to 500° C., such as about 450° C. in some embodiments. In at least one embodiment, the silicon nitride is deposited on the plurality of the first gate electrodes 210a and the plurality of second gate electrodes 210b by reacting a silicon source compound and a nitrogen source. The silicon source compound provides silicon to the deposited silicon nitride and may be silane ($SiH_4$) or tetrathoxysilane (TEOS). The nitrogen source provides nitrogen to the deposited silicon nitride and may be ammonia ($NH_3$) or nitrogen gas ($N_2$). In another embodiment, the carbon-doped silicon nitride is deposited on the plurality of the first gate electrodes 210a and the plurality of second gate electrodes 210b by reacting a carbon source compound, a silicon source compound, and a nitrogen source. The carbon source compound may be an organic compound, such as a hydrocarbon compound, e.g., ethylene ($C_2H_6$).

Figure 2C:
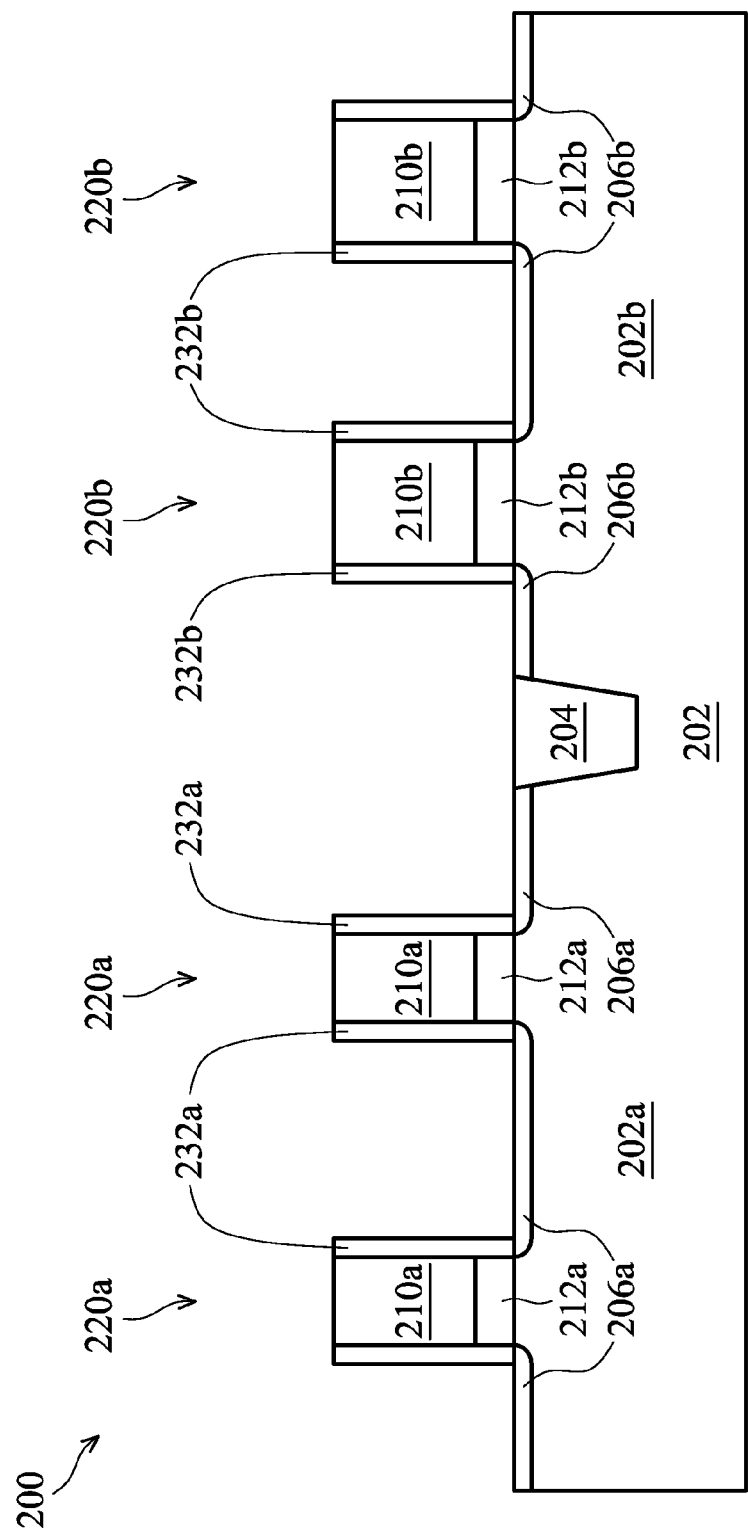

The method 100 in FIG. 1 continues with step 108 in which the structure in FIG. 2C is produced by removing a portion of the first oxygen-sealing layer 232 on top surfaces of the plurality of the first gate electrodes 210a and the plurality of second gate electrodes 210b using a dry etching process (e.g., anisotropic etching), whereby the remaining first oxygen-sealing layer 232a, 232b remains on the sidewall surfaces of the plurality of the first gate electrodes 210a and the plurality of second gate electrodes 210b.

In some embodiments, the remaining first oxygen-sealing layers 232a, 232b may seal the plurality of the first gate stacks 220a and the plurality of the second gate stacks 220b from oxygen-containing structures and/or ambient oxygen in further process steps, so may prevent the transport of oxygen into the region beneath the gate stacks 220a, 220b. This prevention of oxygen transport beneath the gate stacks 220a, 220b may at least partially prevent oxidation of the substrate 202, which could result in the formation of an undesired oxide, such as silicon oxide, beneath the gate stacks 220a, 220b. Such an undesired oxide could be of a thickness enough to degrade device performance if its formation is not prevented. In some embodiments, the dry etching process may have a high selectivity such that the dry etching process does not etch into the surface of the substrate 202. For example, the dry etching process for a silicon nitride film may be performed under a source power of about 150 to 220 W, and a pressure of about 10 to 45 mTorr, using $CH_2F_2$, $O_2$, He, and Ar as etching gases. In this way, according to some embodiments, the remaining first oxygen-sealing layer 232a, 232b for the semiconductor device 200 is formed with almost no recess in the substrate surface.

Figure 2D:
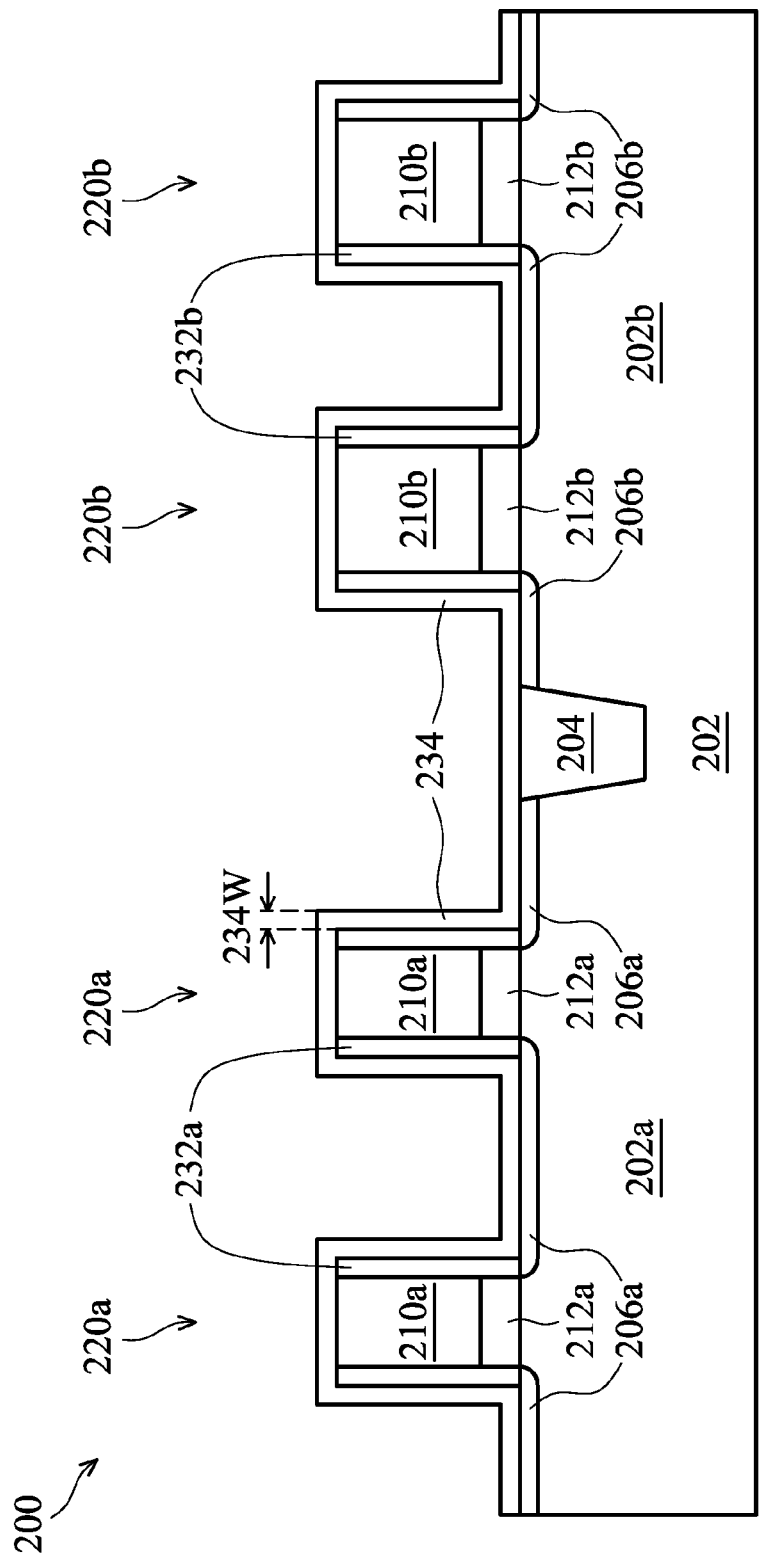

The method 100 in FIG. 1 continues with step 110 in which the structure in FIG. 2D is produced by depositing an oxygen-containing layer 234 on the first oxygen-sealing layer 232a, 232b and top surfaces of the plurality of the first gate electrodes 210a and the plurality of second gate electrodes 210b. In at least one embodiment, the oxygen-containing layer 234 may comprise silicon oxide or silicon oxynitride. The oxygen-containing layer 234 may have any suitable width. In the present embodiment, a maximum width 234w of the oxygen-containing layer 234 is in the range of about 3 to 25 nm. The oxygen-containing layer 234 can be deposited using a CVD or an ALD process. For example, the oxygen-containing layer 234 comprising silicon oxide can be deposited under a pressure less than 10 mTorr and a temperature of about 350° C. to 500° C., such as about 450° C. in some embodiments, using silane ($SiH_4$) and $N_2O$ as reacting precursors.

Figure 2E:
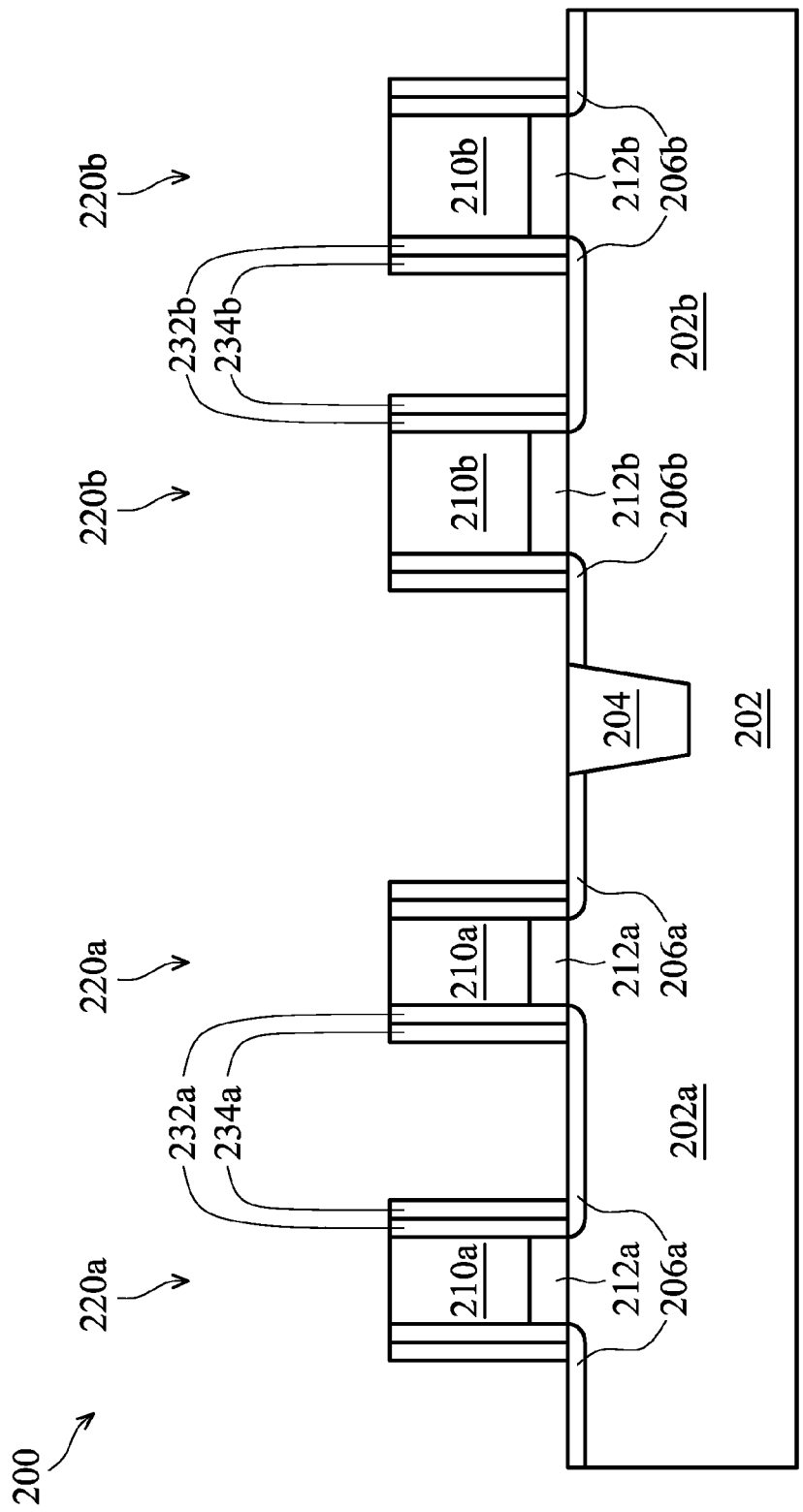

Referring to FIG. 2E, a portion of the oxygen-containing layer 234 on the top surfaces of the plurality of the first gate electrodes 210a and the plurality of second gate electrodes 210b is removed using a dry etching process (e.g., anisotropic etching), whereby the remaining oxygen-containing layer 234a, 234b abuts the first oxygen-sealing layer 232a, 232b. The dry etching process has a high selectivity such that the dry etching process does not etch into the top surfaces of the gate electrodes 210a, 210b and the substrate 202. In at least one embodiment, the dry etching process to etch an oxygen-containing layer 234 comprising silicon oxide may be performed under a glow discharge and a pressure of about 10 mTorr to 3 Torr, using fluorocarbon gas, such as $CF_4$, $C_2F_6$, $C_3F_8$, $CHF_3$, or $CH_2F_2$, as etching gases.

Figure 2F:
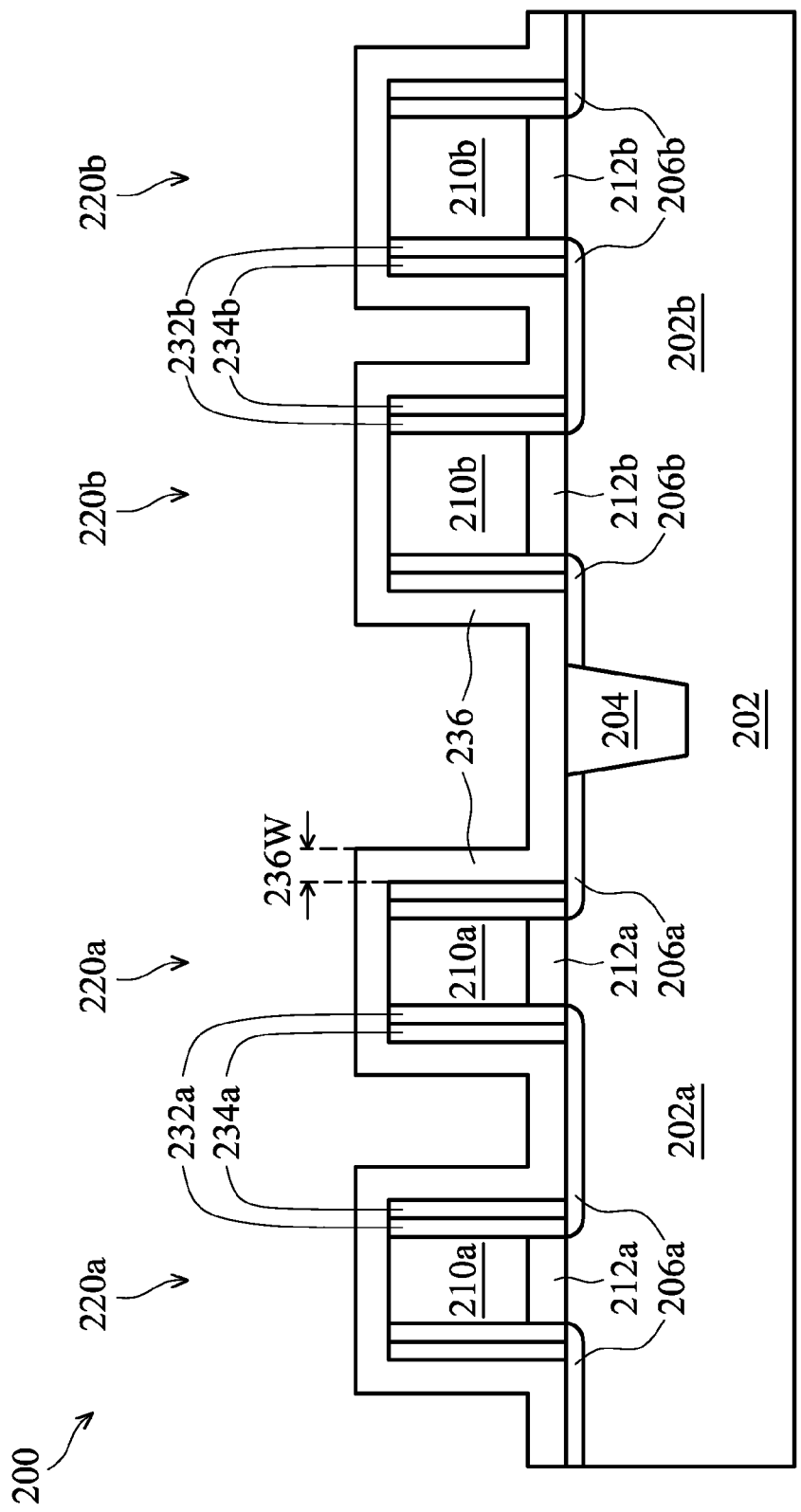

The method 100 in FIG. 1 continues with step 112 in which the structure in FIG. 2F is produced by depositing a second oxygen-sealing layer 236 on the oxygen-containing layer 234a, 234b. In some embodiments, the second oxygen-sealing layer 236 may comprise silicon nitride or carbon-doped silicon nitride. The second oxygen-sealing layer 236 may have any suitable width. In the present embodiment, the second oxygen-sealing layer 236 has a width 236w in the range of about 10 to about 35 nm. In some embodiments, the second oxygen-sealing layer 236 can be deposited using a molecular layer deposition (MLD) process. In at least one embodiment, the MLD process of the present invention is generally carried out under a pressure less than 10 mTorr and in the temperature range from about 350° C. to 500° C., such as about 450° C. In at least one embodiment, the silicon nitride is deposited on the oxygen-containing layer 234a, 234b by reacting a silicon source compound and a nitrogen source. The silicon source compound provides silicon to the deposited silicon nitride and may be silane ($SiH_4$) or tetrathoxysilane (TEOS). The nitrogen source provides nitrogen to the deposited silicon nitride and may be ammonia ($NH_3$) or nitrogen gas ($N_2$). In another embodiment, the carbon-doped silicon nitride is deposited on the oxygen-containing layer 234a, 234b by reacting a carbon source compound, a silicon source compound, and a nitrogen source. The carbon source compound may be an organic compound, such as a hydrocarbon compound, e.g., ethylene ($C_2H_6$).

Figure 2G:
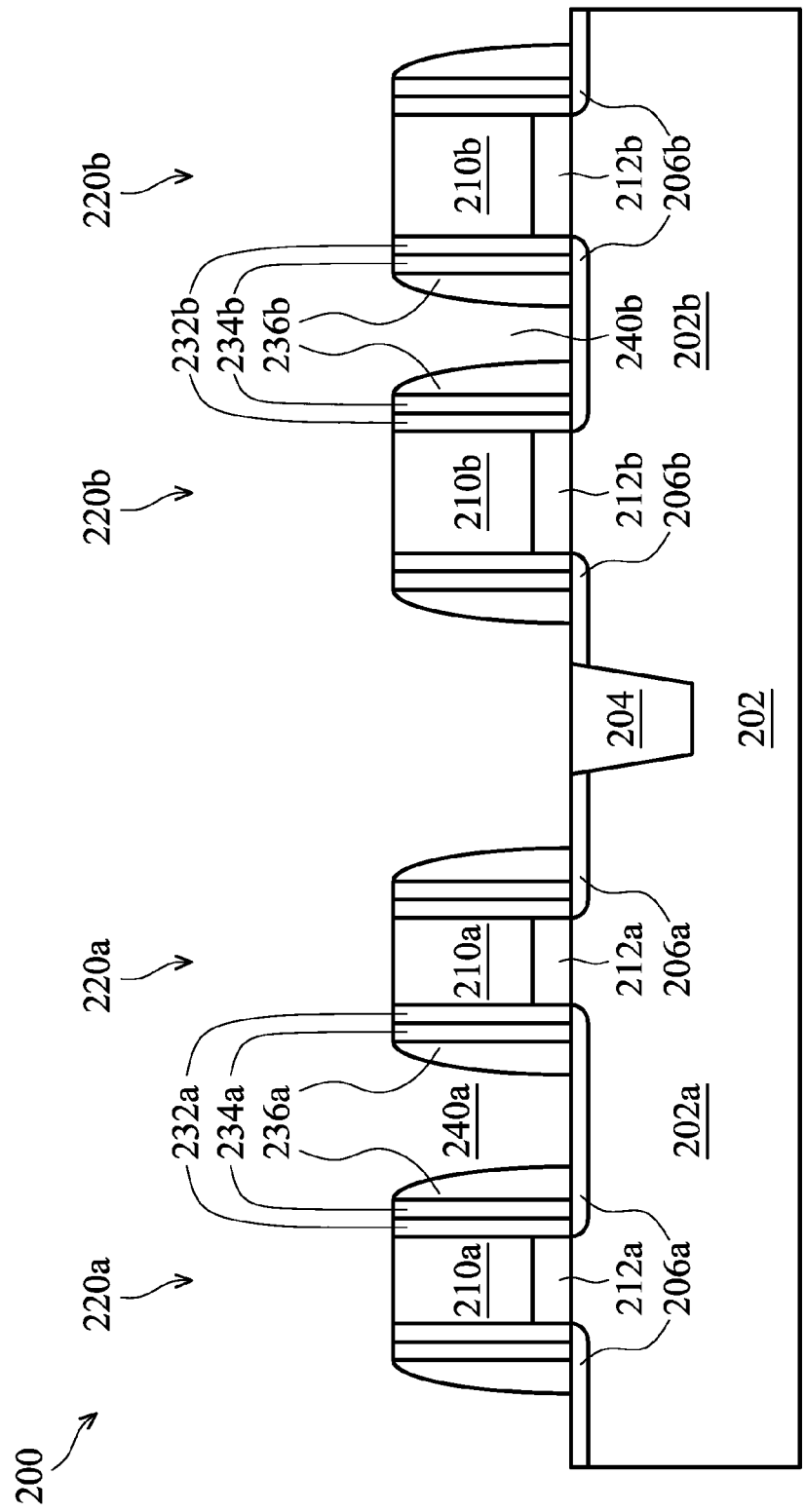

The method 100 in FIG. 1 continues with step 114 in which the structure in FIG. 2G is produced by removing a portion of the second oxygen-sealing layer 236 over top surfaces of the plurality of the first gate electrodes 210a and the plurality of second gate electrodes 210b using a dry etching process (e.g., anisotropic etching), whereby the remaining second oxygen-sealing layer 236a, 236b abuts the oxygen-containing layer 234a, 234b, whereby a first opening 240a is formed between the plurality of the first gate electrodes 210a and a second opening 240b is formed between the plurality of the second gate electrodes 210b. The dry etching process may have a high selectivity such that the dry etching process may stop at the oxygen-containing layer 234a, 234b, the top surfaces of the gate electrodes 210a, 210b and the substrate 202. For example, in some embodiments, the dry etching process may be performed under a source power of about 150 to 220 W, and a pressure of about 10 to 45 mTorr, using $CH_2F_2$, $O_2$, He, and/or Ar as etching gases.

Figure 2H:
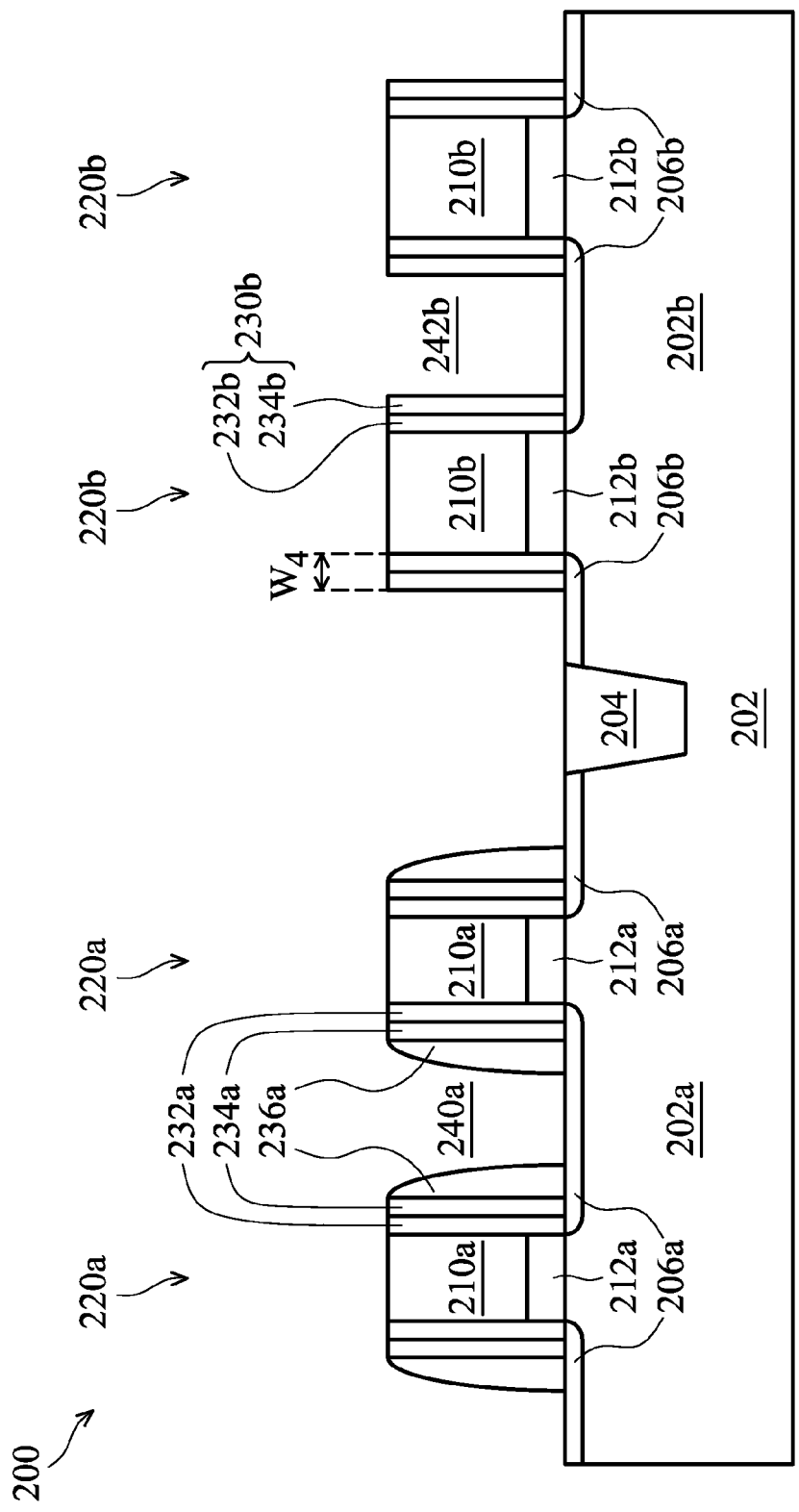

The method 100 in FIG. 1 continues with step 116 in which the structure in FIG. 2H is produced by removing the second oxygen-sealing layer 236b over the second active region 202b using a wet etching process. In the present embodiment, the plurality of the first gate electrodes 210a is covered using a photo-sensitive layer. Then, the wet etching process is accomplished via a phosphoric acid treatment. The wet etching process may form an opening 242b. Aspect ratio of the opening 242b is lower than that of the opening 240b in FIG. 2G. The high aspect ratio of the opening 240b in FIG. 2G makes it more likely that voids will form in subsequently formed layers as there is no enough space between the second oxygen-sealing layer 236b to allow the subsequently formed layer (such as an ILD layer) to fill the small region between the second oxygen-sealing layer 236b. On the other hand, the lower aspect ratio of the opening 242b may impede void formation in the ILD layer (described below with respect to FIG. 2K) thereby decreasing the likelihood of device instability and/or device failure. Further, the first oxygen-sealing layer 232b and the oxygen-containing layer 234b are hereinafter referred to as a plurality of second spacers 230b. A fourth width $W_4$ of each second spacer 230b is in the range of about 6 to 35 nm.

Figure 2I:
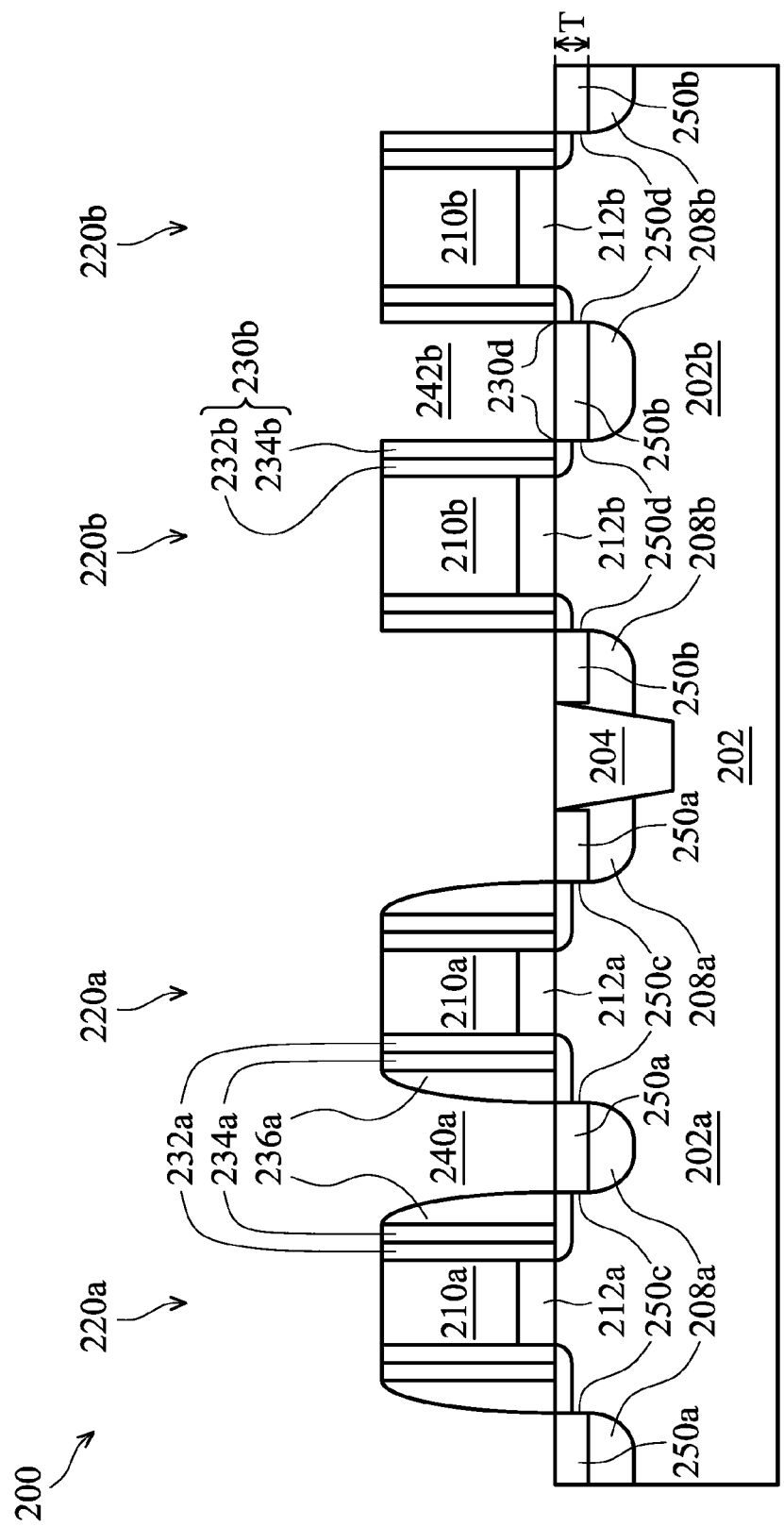

After the device in FIG. 2H has been fabricated, in some embodiments, contacts to connect the device to other IC components may be fabricated. Shown in FIG. 2I is the creation of a plurality of first heavily doped source and drain (S/D) regions 208a in the first active region 202a and a plurality of second S/D regions 208b in the second active region 202b for low resistance contact. This is achieved via ion implantation of boron or phosphorous, at an energy level between about 5 to 150 KeV, at a dose between about 1E15 to 1E 16 atoms/$cm^2$.

Still referring to FIG. 2I, a plurality of first silicide regions 250a in the first active region 202a on opposite sides of the plurality of first gate electrodes 210a and a plurality of second silicide regions 250b in the second active region 202b on opposite sides of the plurality of the second gate electrodes 210b are depicted according to some embodiments. In some embodiments, the plurality of the first and second silicide regions 250a, 250b are formed on the S/D regions 208a, 208b by a self-aligned silicide (salicide) process. For example, the self-aligned silicide (salicide) process may comprise 2 steps. First, a metal material may be deposited via sputtering to the substrate surface at a temperature ranging from 500° C. to 900° C., causing a reaction between the underlying silicon and metal material to form the plurality of the first and second silicide regions 250a, 250b. And then, the un-reacted metal material may be etched away.

The plurality of the first and second silicide regions 250a, 250b may comprise a material selected from titanium silicide, cobalt silicide, nickel silicide, platinum silicide, erbium silicide, or palladium silicide. In some embodiments, a maximum thickness T of the first and second silicide regions 250a, 250b is in the range of about 30 to 50 nm. In addition, each first silicide region 250a on each side of the gate stack 220a comprises an inner edge 250c closest to the first gate stack 220a. Each second silicide region 250b on each side of the gate stack 220b comprises an inner edge 250d closest to the second gate stack 220b. The inner edge 250d is substantially aligned to an outer edge 230d of the each second spacer 230b.

Figure 2J:
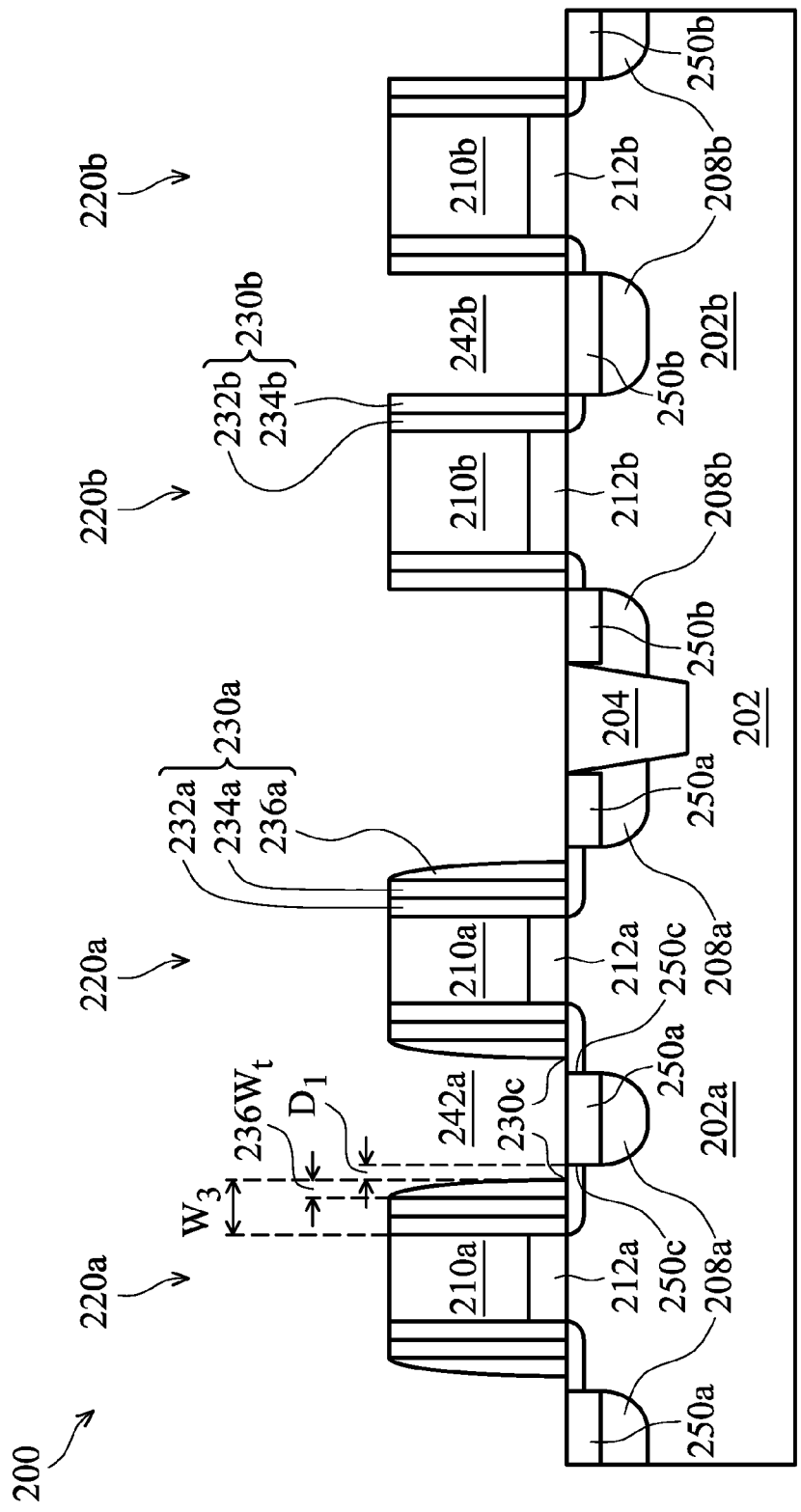
Figure 2K:
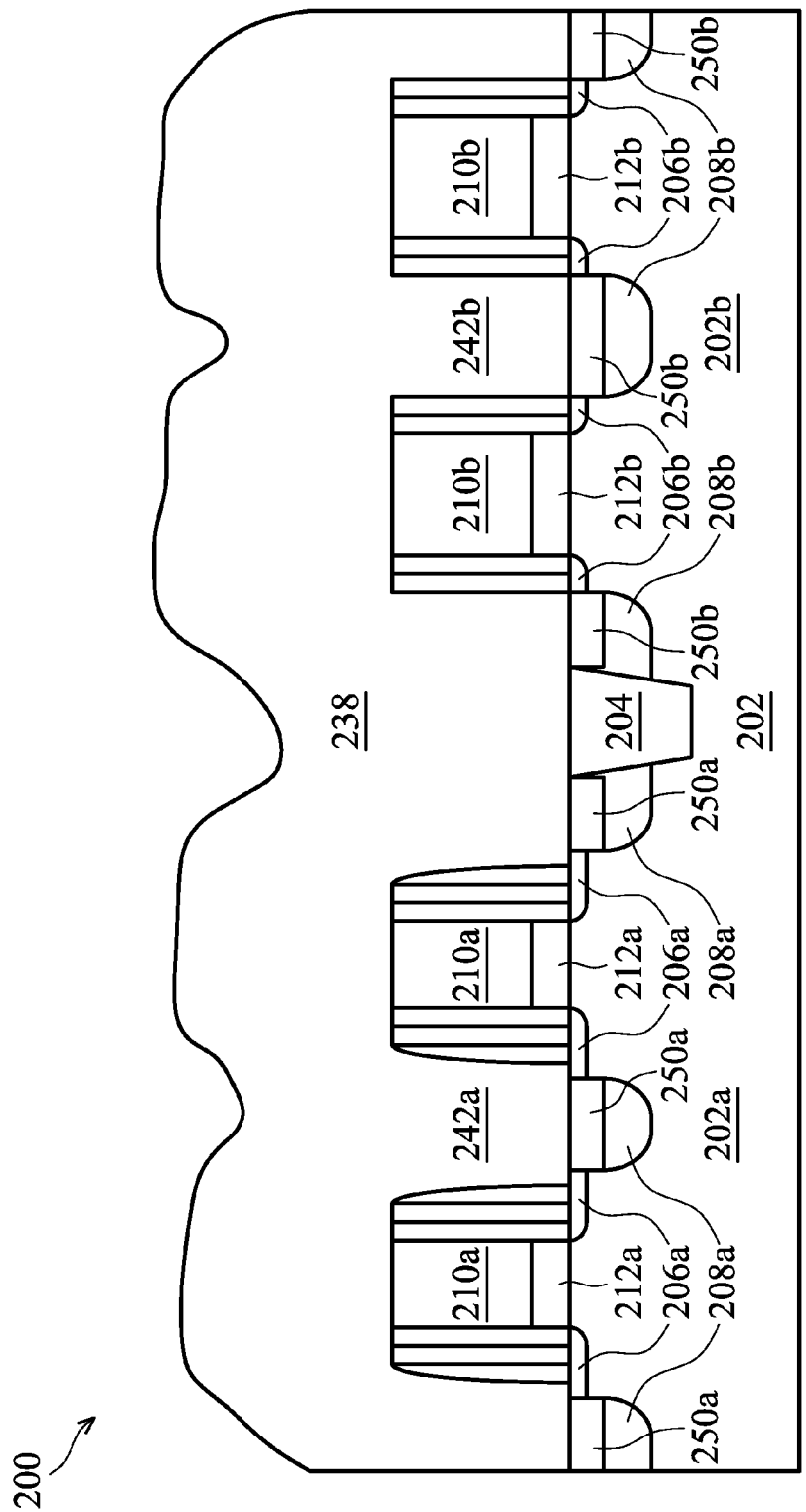

In some embodiment, it may be desirable to reduce the aspect ratio of the opening 240a by thinning the second oxygen-sealing layer 236a. Referring to FIG. 2J, the second oxygen-sealing layer 236a over the plurality of the first gate electrodes 210a is thinned using a wet etching. The wet etching process may have a high selectivity such that the wet etching process may stop at the STI 204, the oxygen-containing layer 234b, the plurality of the first and second gate electrodes 210a, 210b, and the plurality of the first and second silicide regions 250a, 250b. For example, the high selectivity may be accomplished via a phosphoric acid ($H_3PO4$) treatment for a suitable time. The wet etching process may form an opening 242a. Aspect ratio of the opening 242a is lower than that of the opening 240a in FIG. 2I. The high aspect ratio of opening 240a in FIG. 2I may cause voids to form in subsequently formed layers as there is not enough space between the second oxygen-sealing layer 236a to allow the subsequently formed layer (such as an ILD layer) to fill the small region between the second oxygen-sealing layer 236a. On the other hand, the lower aspect ratio of the opening 242a may impede void formation in the ILD layer (described below with respect to FIG. 2K), thereby decreasing the likelihood of device instability and/or device failure.

A maximum width 236wt of the thinned second oxygen-sealing layer 236a is in the range of about 5 to 30 nm. Further, the first oxygen-sealing layer 232a, oxygen-containing layer 234a, and thinned second oxygen-sealing layer 236a are hereinafter referred to as a plurality of first spacers 230a. A third width $W_3$ of each first spacer 230a is in the range of about 12 to 60 nm. Each second spacer 230b has the fourth width $W_4$ less than the third width $W_3$ of each first spacer 230a. Additionally, the inner edge 250c of each first silicide region 250a is offset from the outer edge 230c of the each first spacer 230a by a distance $D_1$ ranging about 120 to 200 angstroms.

In at least some embodiments, devices are encapsulated in ILD layer. In some embodiment, as shown in FIG. 2K, an ILD layer 238 is formed over the structure of depicted in FIG. 2J to a sufficient thickness to form a void-free dielectric layer within the openings 242a, 242b that having decreased aspect ratios according to the exemplary fabrication method depicted in FIGS. 2A-2J. For example, the ILD layer 238 may be deposited to a thickness of 3000 to 4500 Å. In at least one embodiment, the ILD layer 238 may be formed using a CVD process, such as high density plasma (HDP) CVD process or sub-atmospheric CVD (SACVD) process.

Figure 3:
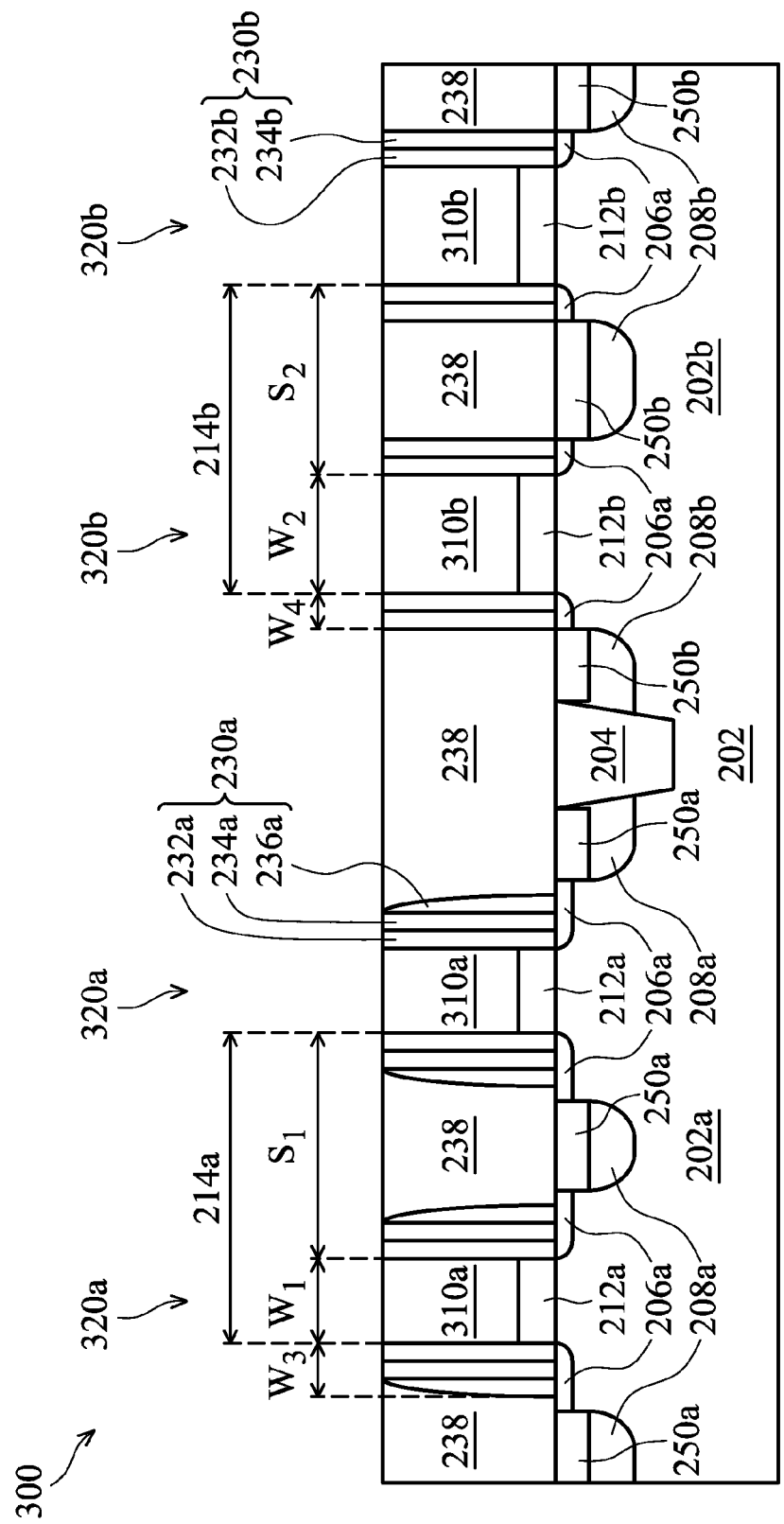
FIG. 3 is a cross-sectional view of a semiconductor device fabricated using the steps shown in FIG. 2A-K according to various aspects of the present disclosure.

Referring to FIG. 3, illustrates a cross-sectional view of a semiconductor device 300 fabricated using the steps shown in FIG. 2A-K according to various aspects of the present disclosure. Similar features in FIGS. 3 and 2K are numbered the same for the sake of simplicity and clarity. FIG. 2K shows the result of a "gate last" process up to the step of depositing the ILD layer 238. Subsequent CMOS processing steps applied to the semiconductor device 200 of FIG. 2K may comprise a chemical mechanical polishing (CMP) on the ILD layer 238 to expose the plurality of the first and second gate stacks 220a, 220b as shown in FIG. 3. The plurality of the first and second gate electrodes 210a, 210b may then be removed from the plurality of the first and second gate stacks 220a, 220b, thereby forming a plurality of trenches.

After the dummy gates are removed, a metal layer may be formed to fill in the trenches. The metal layer may include any metal material suitable for forming a plurality of first and second metal gate electrodes 310a, 310b or portion thereof, including barriers, work function layers, liner layers, interface layers, seed layers, adhesion layers, barrier layers, etc. In some embodiments, the metal layer may include suitable metals, such as TiN, WN, TaN, or Ru that properly perform in the PMOS device. In some alternative embodiments, the metal layer may include suitable metals, such as Ti, Ag, Al, TiAl, TiAlN, TaC, TaCN, TaSiN, Mn, or Zr that properly perform in the NMOS device. Another CMP is performed on the metal layer to form the plurality of the first and second metal gate electrodes 310a, 310b of the semiconductor devices 300. The plurality of first metal gate electrodes 310a and first gate dielectric layer 212a are hereinafter referred to as a first metal gate stacks 320a. The plurality of second metal gate electrodes 310b and first and second gate dielectric layer 212b are hereinafter referred to as a second metal gate stacks 320b. Then, in some embodiments, subsequent processes, including interconnect processing, are performed after forming the semiconductor device 300 to complete the IC fabrication. Accordingly, the disclosed methods of fabricating spacer structures of the semiconductor device 300 may fabricate low aspect ratio openings to form a void-free ILD layer, thereby enhancing the device performance.

In at least some embodiments, the invention can be used to form or fabricate spacer structures for a semiconductor device. In this way, ILD layers with fewer voids for a semiconductor device may be formed One aspect of this description relates to a method of fabricating a semiconductor device. The method includes forming a first set of gate electrodes over a substrate, adjacent gate electrodes of the first set of gate electrodes being separated by a first gap width, and each gate electrode of the first set of gate electrodes having a first gate width. The method further includes forming a second set of gate electrodes over the substrate, adjacent gate electrodes of the second set of gate electrodes being separated by a second gap width less than the first gap width, and each gate electrode of the second set of gate electrodes having a second gate width greater than the first gate width. The method further includes forming a first set of spacer structures on sidewalls of the first and second sets of gate electrodes. The method further includes forming a second set of spacer structures abutting the first set of spacer structures and removing a subset of the second set of spacer structures over the sidewalls of the second set of gate electrodes.

Another aspect of this description relates to a method of fabricating a semiconductor device. The method includes forming a plurality of first gate electrodes arranged according to a gate pitch over a substrate, each first gate electrode having a first width; and forming a plurality of second gate electrodes arranged according to the gate pitch over the substrate, each second gate electrode having a second width greater than the first width. The method further includes forming a first set of spacer structures, each having a first spacer width, on sidewalls of the plurality of first gate electrodes; and forming a second set of spacer structures, each having a second spacer width less than the first spacer width, on sidewalls of the plurality of second gate electrodes.

Still another aspect of this description relates to a method of fabricating a semiconductor device. The method includes forming a first set of gate electrodes over a substrate, adjacent gate electrodes of the first set of gate electrodes having a gate pitch and being separated by a first gap width, and each gate electrode of the first set of gate electrodes having a first gate width. The method further includes forming a second set of gate electrodes over the substrate, adjacent gate electrodes of the second set of gate electrodes having the gate pitch and being separated by a second gap width less than the first gap width, and each gate electrode of the second set of gate electrodes having a second gate width greater than the first gate width. The method further includes forming a first set of spacer structures on sidewalls of the first and second sets of gate electrodes. The method further includes forming a second set of spacer structures abutting the first set of spacer structures and removing a subset of the second set of spacer structures over the sidewalls of the second set of gate electrodes.

While the invention has been described by way of example and in terms of the various embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a semiconductor device, comprising:

forming a first set of gate electrodes over a substrate, adjacent gate electrodes of the first set of gate electrodes being separated by a first gap width, and each gate electrode of the first set of gate electrodes having a first gate width;

forming a second set of gate electrodes over the substrate, adjacent gate electrodes of the second set of gate electrodes being separated by a second gap width less than the first gap width, and each gate electrode of the second set of gate electrodes having a second gate width greater than the first gate width;

forming a first set of spacer structures on sidewalls of the first and second sets of gate electrodes;

forming a second set of spacer structures abutting the first set of spacer structures; and removing a subset of the second set of spacer structures over the sidewalls of the second set of gate electrodes.

2. The method of claim 1, wherein the formation of the first set of spacer structures comprises:

forming an oxygen-sealing layer on the sidewalls of the first and second sets of gate electrodes; and forming an oxygen-containing layer abutting the oxygen-sealing layer.

3. The method of claim 2, wherein the formation of the first set of spacer structures further comprises:

removing a portion of the oxygen-sealing layer on top surfaces of the first and second sets of gate electrodes prior to the formation of the oxygen-containing layer.

4. The method of claim 1, wherein the formation of the second set of spacer structures comprises:

forming an oxygen-sealing layer abutting the first set of spacer structures.

5. The method of claim 4, wherein the formation of the second set of spacer structures further comprises:

removing a portion of the first set of spacer structures on top surfaces of the first and second sets of gate electrodes prior to the formation of the second set of spacer structures.

6. The method of claim 4, further comprising:

thinning the oxygen-sealing layer over the sidewalls of the first set of gate electrodes.

7. The method of claim 1, wherein the removal of the subset of the second set of spacer structures over the sidewalls of the second set of gate electrodes is performed using a wet etching process.

8. The method of claim 7, wherein the wet etching process is performed using a phosphoric acid treatment.

9. A method of fabricating a semiconductor device, comprising:

forming a plurality of first gate electrodes arranged according to a gate pitch over a substrate, each first gate electrode having a first width;

forming a plurality of second gate electrodes arranged according to the gate pitch over the substrate, each second gate electrode having a second width greater than the first width;

forming a first set of spacer structures, each having a first spacer width, on sidewalls of the plurality of first gate electrodes; and forming a second set of spacer structures, each having a second spacer width less than the first spacer width, on sidewalls of the plurality of second gate electrodes.

10. The method of claim 9, wherein the formation of the first set of spacer structures comprises:

depositing a first oxygen-sealing layer on the sidewalls of the plurality of the first gate electrodes;

depositing an oxygen-containing layer abutting the first oxygen-sealing layer; and depositing a second oxygen-sealing layer abutting the oxygen-containing layer.

11. The method of claim 10, further comprising:

thinning the second oxygen-sealing layer.

12. The method of claim 9, wherein the formation of the second set of spacer structures comprises:

depositing a first oxygen-sealing layer on the sidewalls of the plurality of the second gate electrodes;

depositing an oxygen-containing layer abutting the first oxygen-sealing layer;

depositing a second oxygen-sealing layer abutting the oxygen-containing layer; and removing the second oxygen-sealing layer.

13. The method of claim 12, wherein the removal of the second oxygen-sealing layer is performed by using a wet etching process.

14. A method of fabricating a semiconductor device, comprising:

forming a first set of gate electrodes over a substrate, adjacent gate electrodes of the first set of gate electrodes having a gate pitch and being separated by a first gap width, and each gate electrode of the first set of gate electrodes having a first gate width;

forming a second set of gate electrodes over the substrate, adjacent gate electrodes of the second set of gate electrodes having the gate pitch and being separated by a second gap width less than the first gap width, and each gate electrode of the second set of gate electrodes having a second gate width greater than the first gate width; (paragraph 0022)

forming a first set of spacer structures on sidewalls of the first and second sets of gate electrodes;

forming a second set of spacer structures abutting the first set of spacer structures; and removing a subset of the second set of spacer structures over the sidewalls of the second set of gate electrodes.

15. The method of claim 14, wherein the forming the first set of gate electrodes comprises forming the first gate width ranging from about 10 nanometers (nm) to about 30 nm.

16. The method of claim 14, wherein the forming the second set of gate electrodes comprises forming the second gate width ranging from about 12 nm to about 40 nm.

17. The method of claim 14, wherein the forming the first set of gate electrodes comprises forming the first gap width ranging from about 30 nm to about 100 nm.

18. The method of claim 14, wherein the forming the second set of gate electrodes comprises forming the second gap width ranging from about 28 nm to about 90 nm.

19. The method of claim 14, wherein the forming the second set of spacer structures comprises:

forming an oxygen-containing layer abutting the first set of spacer structures; and forming an oxygen sealing layer abutting the oxygen-containing layer.

20. The method of claim 19, wherein removing the subset of the second set of spacer structures comprises removing the oxygen sealing layer.

* * * * *